(12) United States Patent
Chen et al.

(10) Patent No.: US 12,068,395 B2
(45) Date of Patent: Aug. 20, 2024

(54) METHOD FOR FORMING AN UNDOPED REGION UNDER A SOURCE/DRAIN

(71) Applicant: Taiwan Semiconductor Manufacturing Co., Ltd., Hsinchu (TW)

(72) Inventors: Meng-Ku Chen, New Taipei (TW); Ji-Yin Tsai, Zhudong Township (TW); Jeng-Wei Yu, New Taipei (TW); Yi-Fang Pai, Hsinchu (TW); Pei-Ren Jeng, Chu-Bei (TW); Yee-Chia Yeo, Hsinchu (TW); Chii-Horng Li, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 405 days.

(21) Appl. No.: 17/351,679

(22) Filed: Jun. 18, 2021

(65) Prior Publication Data
US 2022/0336640 A1  Oct. 20, 2022

Related U.S. Application Data

(60) Provisional application No. 63/174,641, filed on Apr. 14, 2021.

(51) Int. Cl.
*H01L 29/66* (2006.01)
*H01L 21/762* (2006.01)
(Continued)

(52) U.S. Cl.
CPC .. *H01L 29/66795* (2013.01); *H01L 21/76224* (2013.01); *H01L 21/823418* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 10,134,901 B1 * 11/2018 Pawlak ............... H01L 29/7848
10,217,815 B1 * 2/2019 Chu .................. H01L 21/02227
(Continued)

FOREIGN PATENT DOCUMENTS

CN  107785261 A  3/2018
CN  111725067 A  9/2020
(Continued)

*Primary Examiner* — Younes Boulghassoul
(74) *Attorney, Agent, or Firm* — Slater Matsil, LLP

(57) ABSTRACT

A method includes forming a semiconductor fin protruding higher than a top surface of an isolation region. The semiconductor fin overlaps a semiconductor strip, and the semiconductor strip contacts the isolation region. The method further includes forming a gate stack on a sidewall and a top surface of a first portion of the semiconductor fin, and etching the semiconductor fin and the semiconductor strip to form a trench. The trench has an upper portion in the semiconductor fin and a lower portion in the semiconductor strip. A semiconductor region is grown in the lower portion of the trench. Process gases used for growing the semiconductor region are free from both of n-type dopant-containing gases and p-type dopant-containing gases. A source/drain region is grown in the upper portion of the trench, wherein the source/drain region includes a p-type or an n-type dopant.

20 Claims, 14 Drawing Sheets

(51) Int. Cl.
*H01L 21/8234* (2006.01)
*H01L 29/06* (2006.01)
*H01L 29/10* (2006.01)
*H01L 29/78* (2006.01)
*H01L 27/088* (2006.01)
*H01L 29/08* (2006.01)

(52) U.S. Cl.
CPC ......... *H01L 21/823431* (2013.01); *H01L 21/82345* (2013.01); *H01L 29/0642* (2013.01); *H01L 29/1083* (2013.01); *H01L 29/66545* (2013.01); *H01L 29/66636* (2013.01); *H01L 29/785* (2013.01); *H01L 27/0886* (2013.01); *H01L 29/0847* (2013.01)

(58) Field of Classification Search
CPC .......... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823418; H01L 21/823814; H01L 29/0847; H01L 29/7848; H01L 29/78618; H01L 29/66636; H01L 29/66575; H01L 29/0642–0653; H01L 29/1083
See application file for complete search history.

(56) References Cited

U.S. PATENT DOCUMENTS

| | | | |
|---|---|---|---|
| 10,483,396 B1* | 11/2019 | Chin | H01L 29/6681 |
| 11,094,800 B2 | 8/2021 | Son et al. | |
| 11,244,945 B2 | 2/2022 | Huang et al. | |
| 11,251,302 B2 | 2/2022 | Jambunathan et al. | |
| 2015/0295089 A1 | 10/2015 | Huang et al. | |
| 2015/0303118 A1 | 10/2015 | Wang et al. | |
| 2016/0027875 A1* | 1/2016 | Kim | H01L 21/02636 |
| | | | 257/401 |
| 2016/0056290 A1* | 2/2016 | Tsai | H01L 21/02576 |
| | | | 257/192 |
| 2018/0174912 A1* | 6/2018 | Lee | H01L 21/8221 |
| 2019/0165100 A1* | 5/2019 | Kuo | H01L 21/02521 |
| 2019/0312143 A1* | 10/2019 | Lin | H01L 29/66795 |
| 2019/0341472 A1* | 11/2019 | Lee | H01L 29/66795 |
| 2020/0006548 A1 | 1/2020 | Chin et al. | |
| 2020/0105876 A1* | 4/2020 | Ting | H01L 29/7848 |
| 2020/0135861 A1* | 4/2020 | Yang | H01L 21/823431 |
| 2020/0135923 A1* | 4/2020 | Wang | H01L 29/0653 |
| 2020/0303521 A1* | 9/2020 | Son | H01L 29/66439 |
| 2020/0395237 A1* | 12/2020 | Lin | H01L 29/66795 |

FOREIGN PATENT DOCUMENTS

| | | |
|---|---|---|
| KR | 20200111997 A | 10/2020 |
| TW | 201924065 A | 6/2019 |
| TW | 202109886 A | 3/2021 |

* cited by examiner

METHOD FOR FORMING AN UNDOPED REGION UNDER A SOURCE/DRAIN

PRIORITY CLAIM AND CROSS-REFERENCE

This application claims the benefit of the following provisionally filed U.S. Patent application: Application No. 63/174,641, filed on Apr. 14, 2021, and entitled "Undoped Bottom Si for Source/Drain," which application is hereby incorporated herein by reference.

BACKGROUND

In the formation of integrated circuits, deep source/drain regions are formed for transistors, so that the channel resistance may be reduced. The performance of the corresponding transistors may thus be improved. The formation of deep source/drain regions, however, may result in the increase in the leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
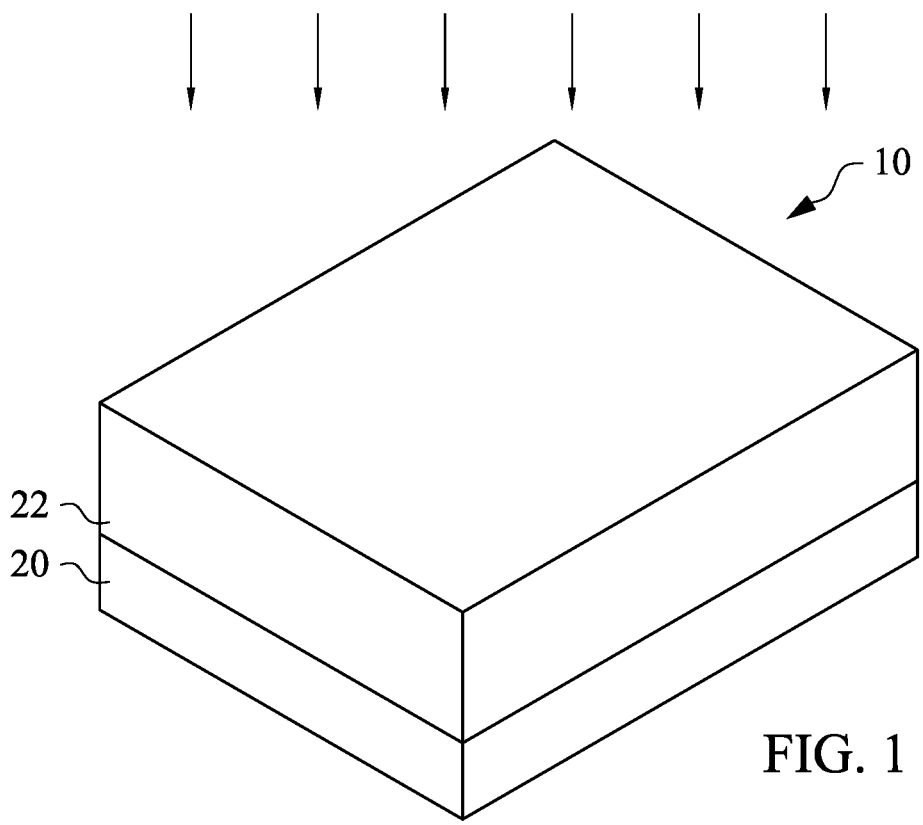
FIGS. 1-4, 5A, 5B, 6A, 6B, 6C, 7A, 7B, 8A, 8B, 9A, 9B, 10, 11A, 11B, 12, 13A, and 13B illustrate the cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided. In accordance with some embodiments of the present disclosure, a semiconductor fin, on which a gate stack is formed, is etched to form a trench. The trench extends deeply into a semiconductor strip underlying the semiconductor fin, so that the upper portion of the trench in the semiconductor fin has a more vertical sidewall, and is closer to the channel region of the FinFET. A semiconductor region, which is undoped or unintentionally doped, is epitaxially grown at the bottom of the trench. The semiconductor region may have a top surface level with (within process variation) or slightly lower than the bottom of the semiconductor fin. A doped source/drain region is then epitaxially grown on the semiconductor region. By forming the semiconductor region that has none or low doping concentration, the leakage current between neighboring source/drain regions is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A 6B, 6C, 7A, 7B, 8A, 8B, 9A, 9B, 10, 11A, 11B, 12, 13A, and 13B illustrate the cross-sectional views of intermediate stages in the formation of a FinFET in accordance with some embodiments of the present disclosure. The corresponding processes are also reflected schematically in the process flow shown in FIG. 14.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In accordance with some embodiments, substrate 20 is doped with a p-type or n-type dopant. The p-type (or n-type) dopant concentration, which may be intentionally doped or unintentionally doped, may be in the range between about $1E17/cm^3$ and about $1E18/cm^3$. In accordance with some embodiments, the top surface of semiconductor substrate 20 is on a (100) surface plane of the crystalline semiconductor substrate 20.

Figure 14:
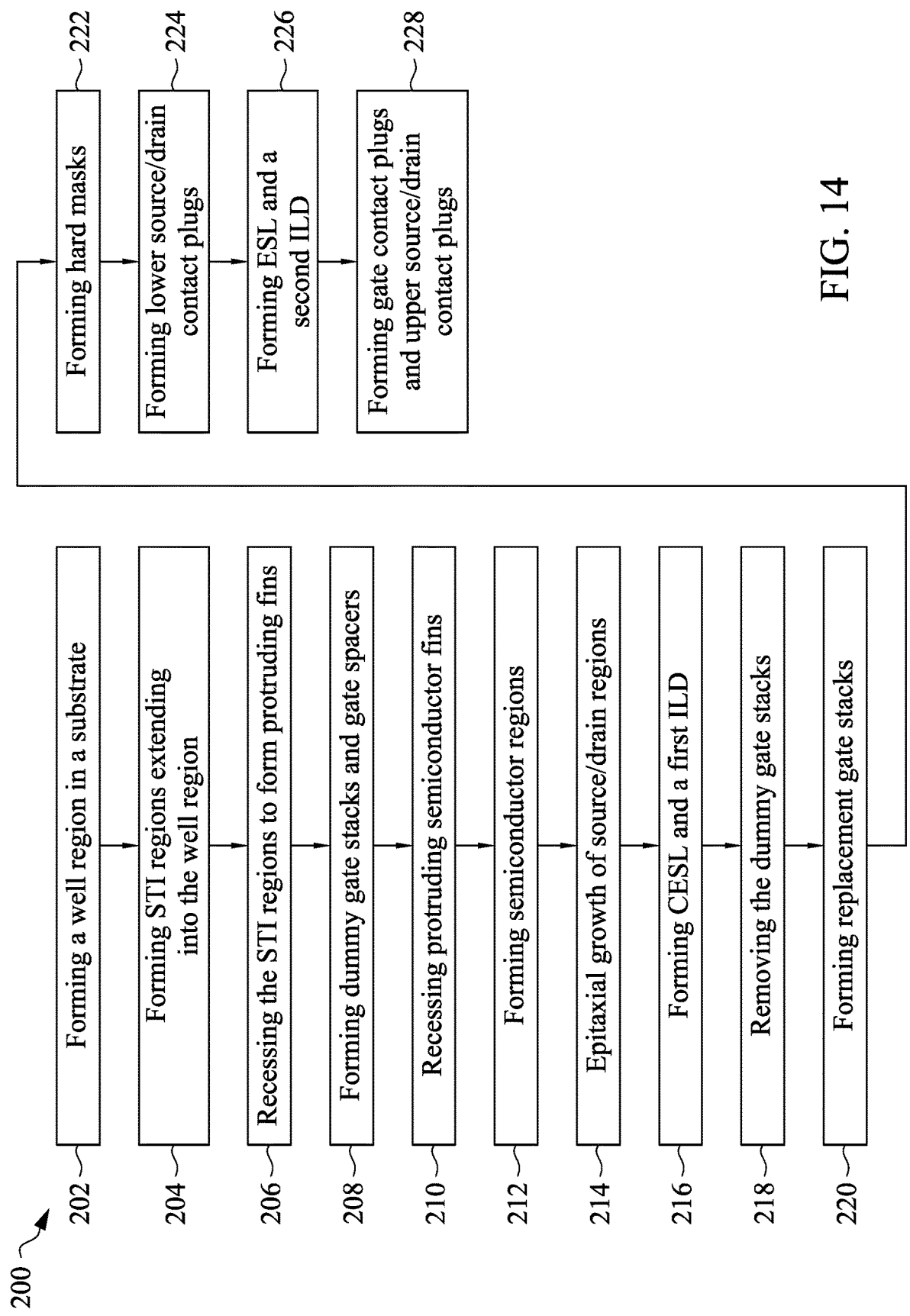
FIG. 14 illustrates a process flow for forming a FinFET in accordance with some embodiments.

Further referring to FIG. 1, well region 22 is formed in substrate 20. The respective process is illustrated as process 202 in the process flow 200 as shown in FIG. 14. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration in well region 22 may be equal to or less than $1E18/cm^3$, such as in the range between about $1E18/cm^3$ and about $1E19/cm^3$.

Figure 2:
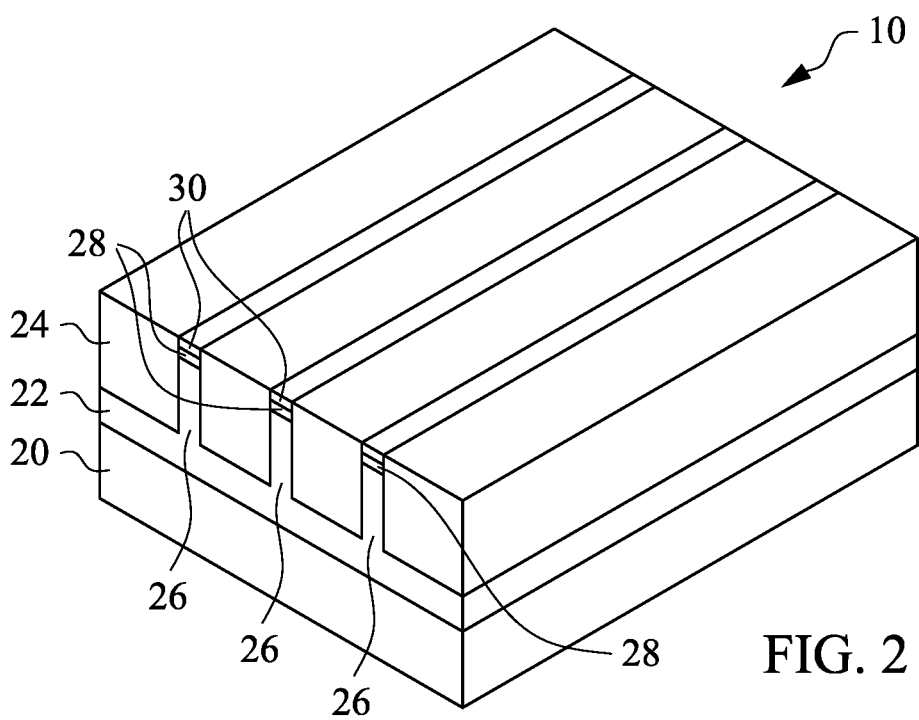

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 14. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Atomic Layer Deposition (ALD), Low-Pressure Chemical Vapor Deposition (LPCVD), Plasma Enhanced Chemical Vapor Deposition (PECVD), or the like. A photo resist (not shown) is formed on hard mask layer 30 and is then patterned. Hard mask layer 30 is then patterned using the patterned photo resist as an etching mask to form hard mask layers 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, ALD, High-Density Plasma Chemical Vapor Deposition (HDPCVD), Chemical Vapor Deposition (CVD), or the like. STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

Semiconductor strips 26 are between neighboring STI regions 24. In accordance with some embodiments of the present disclosure, semiconductor strips 26 are parts of the original substrate 20 and well region 22, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
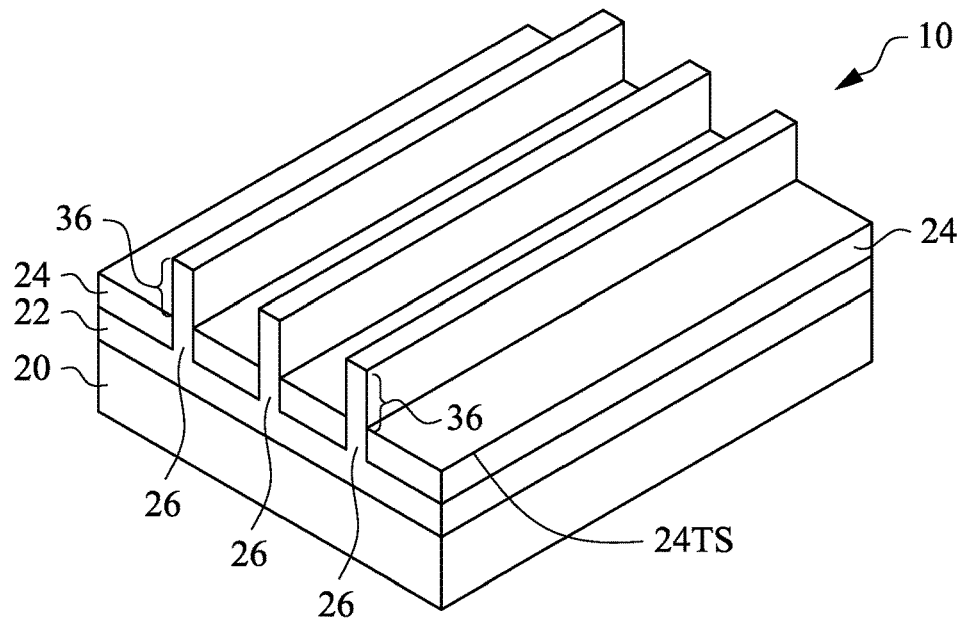

Referring to FIG. 3, STI regions 24 are recessed, so that the top portions of semiconductor strips 26 protrude higher than the top surfaces 24TS of the remaining portions of STI regions 24 to form protruding fins 36. The respective process is illustrated as process 206 in the process flow 200 as shown in FIG. 14. The etching may be performed using a dry etching process, wherein HF and $NH_3$, for example, are used as the etching gases. During the etching process, plasma may be generated. Argon may also be included. In accordance with alternative embodiments of the present disclosure, the recessing of STI regions 24 is performed using a wet etching process. The etching chemical may include diluted HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
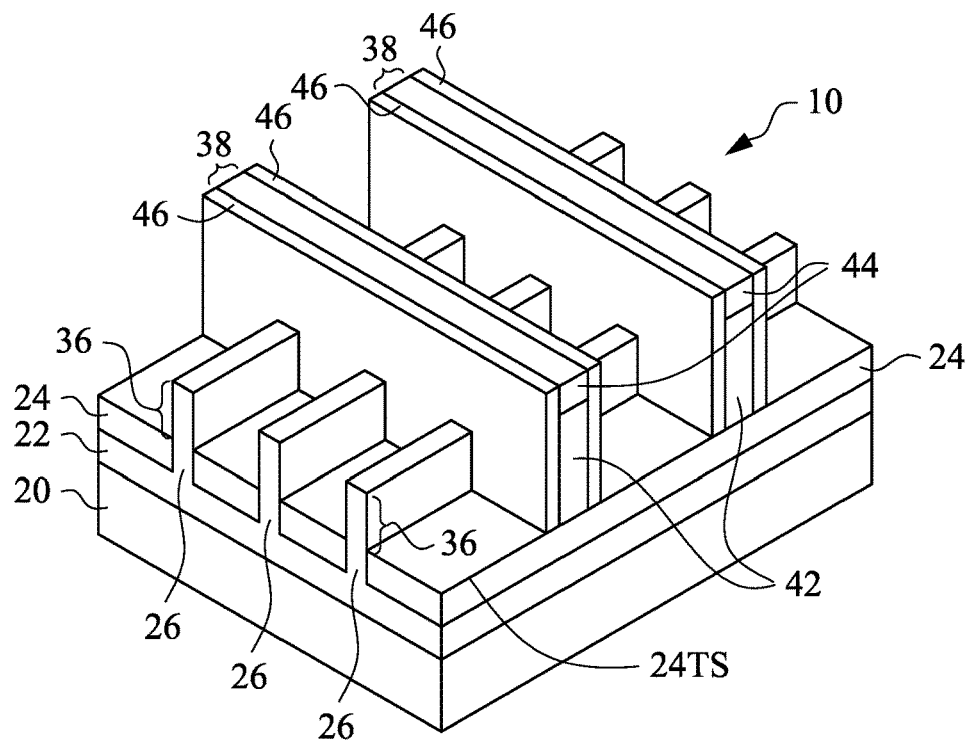

Referring to FIG. 4, dummy gate stacks 38 are formed to extend on the top surfaces and the sidewalls of (protruding) fins 36. The respective process is illustrated as process 208 in the process flow 200 as shown in FIG. 14. Dummy gate stacks 38 may include dummy gate dielectrics 40 (FIG. 7A) and dummy gate electrodes 42 over dummy gate dielectrics 40. Dummy gate electrodes 42 may be formed, for example, using polysilicon, and other materials such as amorphous silicon or amorphous carbon may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 as shown in FIG. 14. In accordance with some embodiments of the present disclosure, gate spacers 46 are formed of a dielectric material(s) such as silicon nitride, silicon carbo-nitride, silicon oxy-carbo-nitride, or the like, and may have a single-layer structure or a multi-layer structure including a plurality of dielectric layers. At the same time gate spacers 46 are formed, fin spacers (not shown) may also be formed on the sidewalls of protruding fins 36.

Figure 5A:
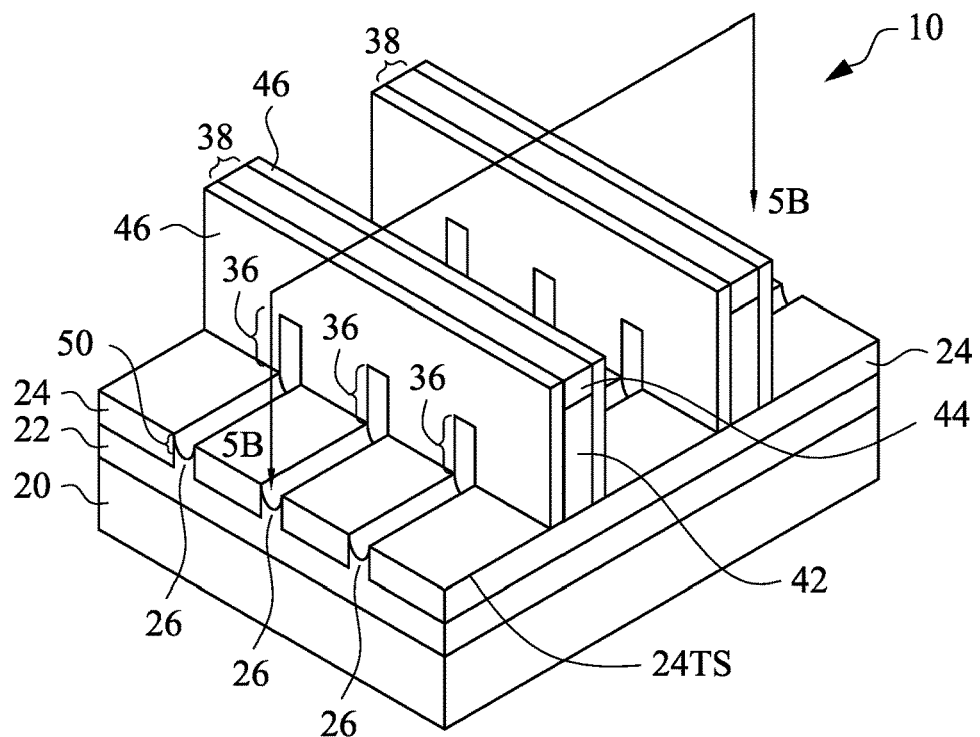
Figure 5B:
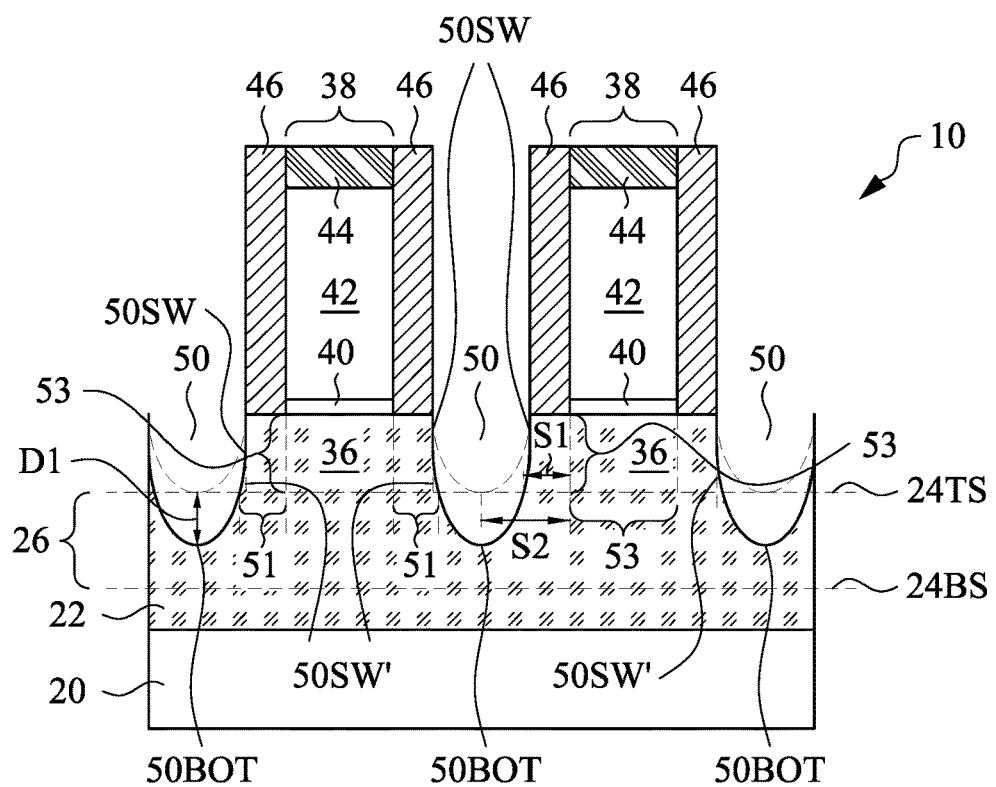

In accordance with some embodiments, an implantation process is performed to form source/drain extension regions 51 (FIG. 5B). The implantation process may include tilt implantation processes, so that source/drain extension regions 51 extend into the regions directly underlying gate spacers 46, and are on opposite sides of channel regions 53 of the resulting FinFET. Source/drain extension regions 51 have a same conductivity type (p-type or n-type) as, and have a lower doping concentration than, the subsequently formed source/drain regions 60. In accordance with some embodiments, source/drain extension regions 51 have a p-type or n-type doping concentration lower than about $1E19/cm^3$, such as in the range between about $5E17/cm^3$ and about $1E19/cm^3$. In accordance with alternative embodiments, source/drain extension regions 51 may be formed in a later process, for example, after the epitaxy processes for forming epitaxy regions 60.

An etching process is then performed to etch the portions of protruding fins 36 that are not covered by dummy gate stacks 38 and gate spacers 46, resulting in the structure shown in FIGS. 5A and 5B. The respective process is illustrated as process 210 in the process flow 200 as shown in FIG. 14. The levels of the top surfaces 24TS and bottom surfaces 24BS are illustrated. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24TS of STI regions 24 in accordance with some embodiments, and may be higher than the bottom surfaces 24BS of STI regions 24. Trenches 50 are accordingly formed. Trenches 50 comprise portions located on the opposite sides of dummy gate stacks 38, and portions between remaining portions of protruding fins 36. The etching may include a dry etching process, which may be performed using process gases such as $C_2F_6$, $CF_4$, $SO_2$, the mixture of HF and ozone, the mixture of HBr, $Cl_2$, and $O_2$, the mixture of HBr, $Cl_2$, $O_2$, and $CF_2$ etc., or the like. The etching may be anisotropic.

Referring to FIG. 5B, which shows the reference cross-section 5B-5B in FIG. 5A, trenches 50 are deep trenches having bottoms 50BOT lower than the top surfaces 24TS of STI regions 24. Since the top surfaces 24TS of STI regions 24 are also at the same level as the bottoms of protruding fins 36, trenches 50 also extend to a level lower than the bottoms of protruding fins 36. In accordance with some embodiments, depth D1, which is the depth measured from the bottom of protruding fins 36 to the bottom of trenches 50, may be greater than about 2 nm, and may be in the range between about 2 nm and about 4 nm. In accordance with some embodiments, the sidewalls 50SW of trenches 50 have straight and vertical upper portions. Close to the bottom of trenches 50, the lower portions of sidewalls 50SW start to become tapered and curved, and hence form a U-shaped or V-shaped bottom (having curved sidewalls and bottoms).

In accordance with some embodiments, the vertical-and-straight upper portions of sidewalls 50SW extend to the bottom level of protruding fins 36, which vertical-and-straight sidewall are represented by dashed lines 50SW' in FIG. 5B. In accordance with some embodiments, the joining points between the vertical-and-straight sidewall upper portions and the curved lower portions are at top surface level 24TS, which is also the bottoms level of protruding fins 36. In accordance with alternative embodiments, the curved sidewall portions start at a level higher than top surface level 24TS, as shown in FIG. 5B. The formation of deep trenches 50 may ensure that significant portions, or entireties, of the sidewalls 50SW of protruding fins 36 are vertical-and-straight. The bottom proximity S1, which is the lateral distance from the channel regions 53 (of the resulting FinFET) to the nearest source/drain regions 60, is small. As a comparison, if trenches 50 are formed as shallow trenches, for example, with the bottom at the same level as the bottom level of protruding fins 36, the bottom proximity will be increased to S2, which is greater than S1. Since proximity S1 or S2 is located in the regions (source/drain extension regions 51) with a low doping concentration, the resistance of these regions is high. Accordingly, forming deep trenches 50 may reduce channel resistance, and reduce the resistance between source and drain regions, and hence the performance of the resulting FinFET is improved.

Figure 6A:
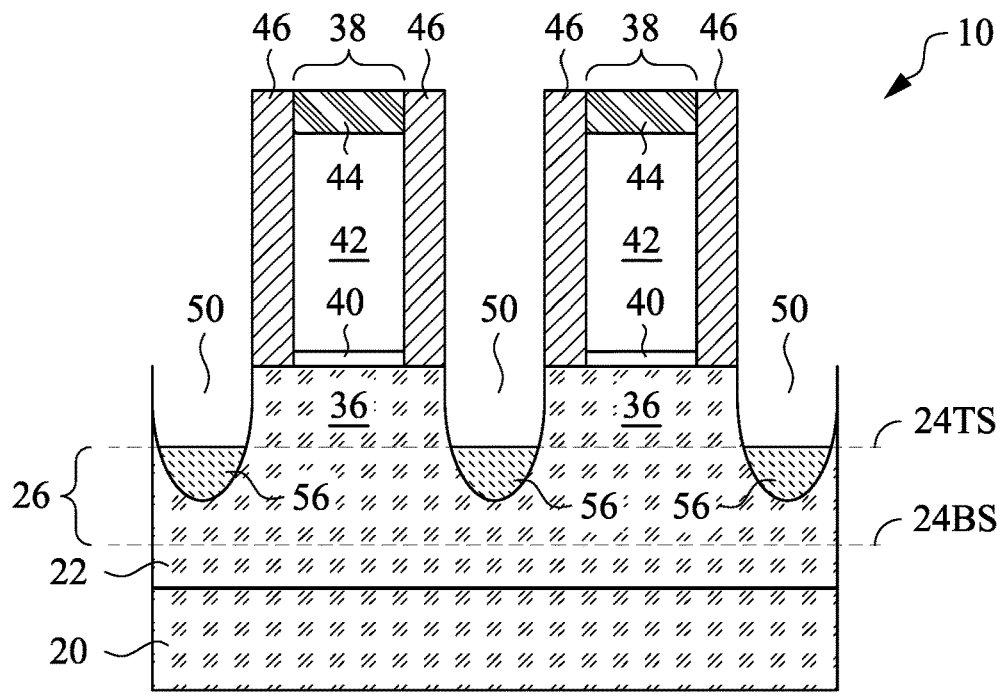
Figure 6B:
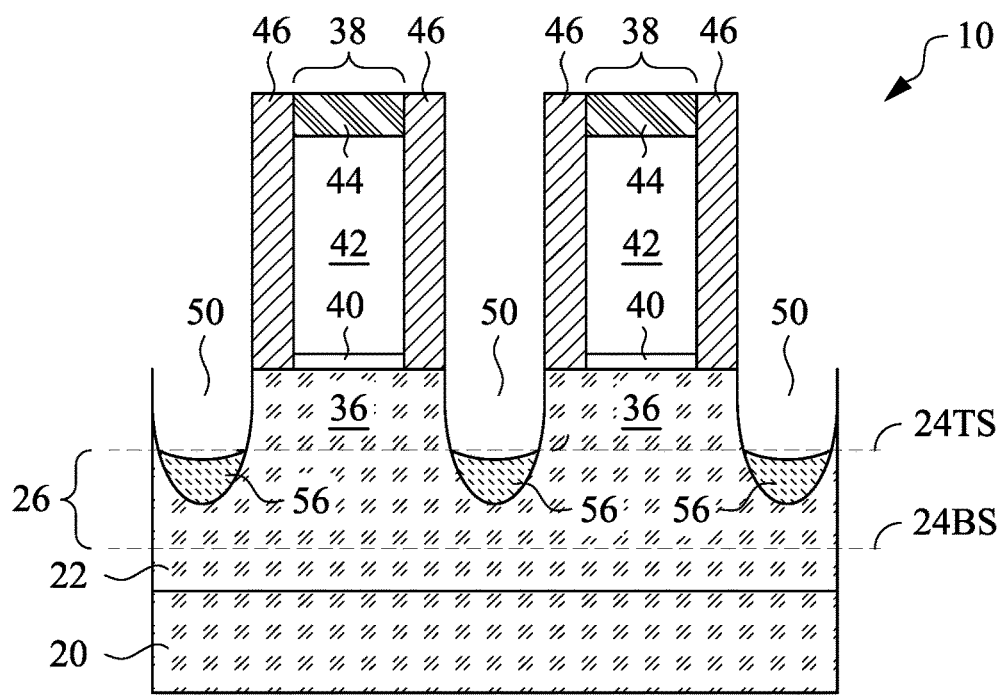
Figure 6C:
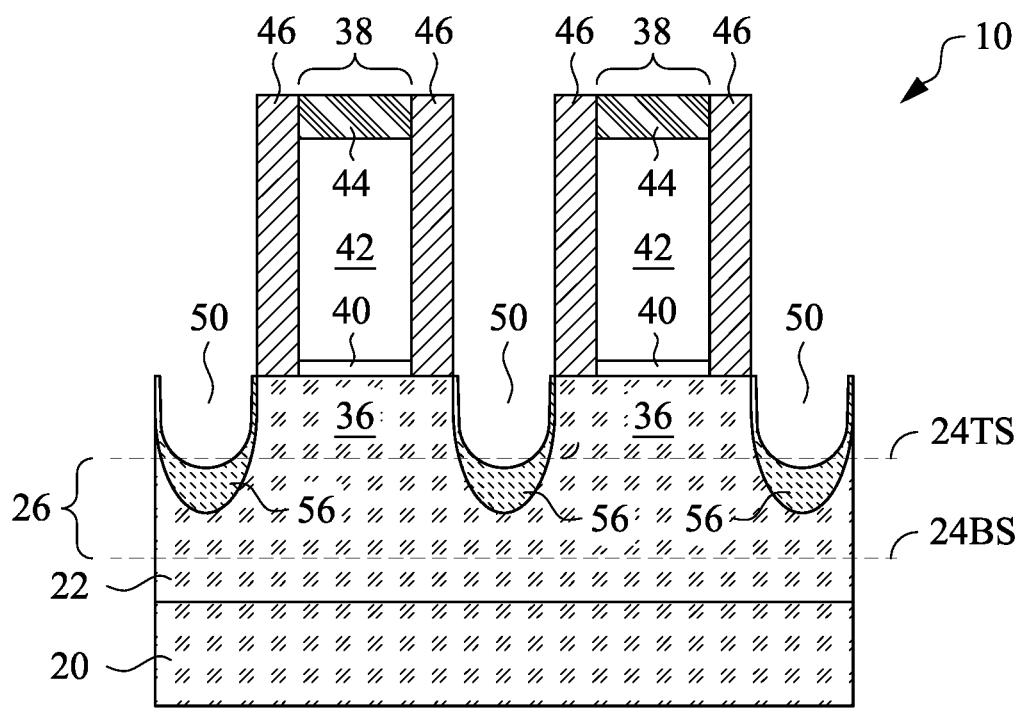

Extending trenches 50 deep into semiconductor strips 26, however, may result in the leakage current, which is between neighboring source/drain regions 60 (FIG. 13A) to adversely increase. In accordance with some embodiments, semiconductor regions 56, which are undoped, unintentionally doped, or intentionally doped with low n-type or p-type doping concentrations, are formed, as shown in FIG. 6A, 6B, or 6C.

In accordance with some embodiments, semiconductor regions 56 are formed through a selective epitaxy process. The selective epitaxy process is also a bottom-up deposition process. The respective process is illustrated as process 212 in the process flow 200 as shown in FIG. 14. Semiconductor regions 56 may comprise silicon (without Ge, C, or the like therein), SiGe, carbon-doped silicon (SiC), or the like. For example, when the resulting FinFET is an n-type FinFET, Semiconductor regions 56 may comprise silicon or carbon-doped silicon. When the resulting FinFET is a p-type FinFET, semiconductor regions 56 may comprise silicon, SiGe, or germanium.

The deposition may be performed using Reduced Pressure Chemical Vapor Deposition (RPCVD), PECVD, or the like. The process gases for depositing semiconductor regions 56 may include a silicon-containing gas such as silane, disilane ($Si_2H_6$), dicholorosilane (DCS), or the like. A germanium-containing gas such as germane ($GeH_4$), digermane ($Ge_2H_6$), or the like may be used or added to the silicon-containing gas if the resulting semiconductor regions 56 are to include germanium. An etching gas such as HCl is added into the process gases to achieve selective deposition on semiconductor, but not on dielectric. Carrier gas(es) such as $H_2$ and/or $N_2$ may also be included in the process gas. The bottom-up deposition may be achieved by adjusting process conditions such as the flow rate ratio of process gases. For example, the ratio of the flow rate(s) of Si/Ge containing gas(es) to the flow rate of the etching gas may be adjusted. The growth rates of semiconductor regions 56 on different surface planes are different. For example, the growth on the (100) surface (which is the surface of semiconductor strips 26 at the bottoms of trenches 50) is faster than on the (110) surface (the sidewall surfaces of substrate 20 and protruding fins 36). The proper flow rate may ensure to etch and fully remove the semiconductor grown on the (110) surface, while the grown semiconductor on the (100) surface is partially etched. The net result is there is growth of semiconductor region on the (100) surface (the top surfaces of semiconductor at the bottoms of trenches 50), and not on the (110) surfaces (the sidewall surfaces in trenches 50). Accordingly, the growth is bottom-up.

In accordance with some embodiments, in the process gases for forming semiconductor regions 56, there is no n-type dopant-containing gas, and there is no p-type dopant-containing gas. Accordingly, the resulting semiconductor regions 56 may be intrinsic. There may be, or may not be, residues in the process chamber that is used for growing semiconductor regions 56. The residues, depending on what were grown previously in the process chamber, and whether/how the process chamber was cleaned, may include p-type dopants such as boron and/or indium, and/or n-type dopants such as phosphorous, arsenic, antimony, and/or the like. Other dopants such as oxygen (O) may also be left in the process chamber. These residues are doped into semiconductor regions 56. Since in these embodiments, these dopants are not intended to be doped into semiconductor regions 56, these dopants are referred to as unintentionally doped. The unintentionally doped dopants may be p-type or n-type regardless of whether the subsequently grown source/drain regions 60 (FIG. 7A) are p-type or n-type. In accordance with some embodiments, the unintentionally doped dopants have concentrations that may have any value lower than about $1E18/cm^3$, lower than about $1E17/cm^3$, lower than about $1E16/cm^3$, lower than about $1E15/cm^3$, or in the range between about $1E17/cm^3$ and about $1E18/cm^3$. Semiconductor regions 56, as deposited, may also have no unintentionally doped dopants, and are thus intrinsic.

In accordance with alternative embodiments, semiconductor regions 56 are in-situ doped intentionally during the epitaxy to a same conductivity type as the overlying source/drain regions 60. The in-situ doping is performed by conducting a dopant-containing process gas into the process chamber. For example, when the source/drain regions 60 are of p-type, boron and/or indium may be doped into semiconductor regions 56. When the source/drain regions are of n-type, phosphorous, arsenic, and/or antimony may be doped into semiconductor regions 56. For example, semiconductor regions 56 may be intentionally doped to the dopant concentration of lower than about $1E17/cm^3$, which dopant concentration may also be lower than about $1E16/cm^3$, $1E15/cm^3$, or about $1E14/cm^3$.

In accordance with alternative embodiments, semiconductor regions 56 are in-situ anti-doped intentionally during the epitaxy to have a conductivity type opposite to the conductivity type of the overlying source/drain regions 60. Accordingly, the dopant is of the same conductivity type as well region 22. The in-situ doping is performed by conducting a dopant-containing process gas. For example, when the source/drain regions 60 are of n-type, boron and/or indium may be anti-doped into semiconductor regions 56. When the source/drain regions 60 are of p-type, phosphorous, arsenic, and/or antimony may be anti-doped into semiconductor regions 56. For example, semiconductor regions 56 may be intentionally doped to the dopant concentration of lower than about $1E17/cm^3$, which dopant concentration may also be lower than about $1E16/cm^3$, $1E15/cm^3$, or about $1E14/cm^3$.

Figure 7A:
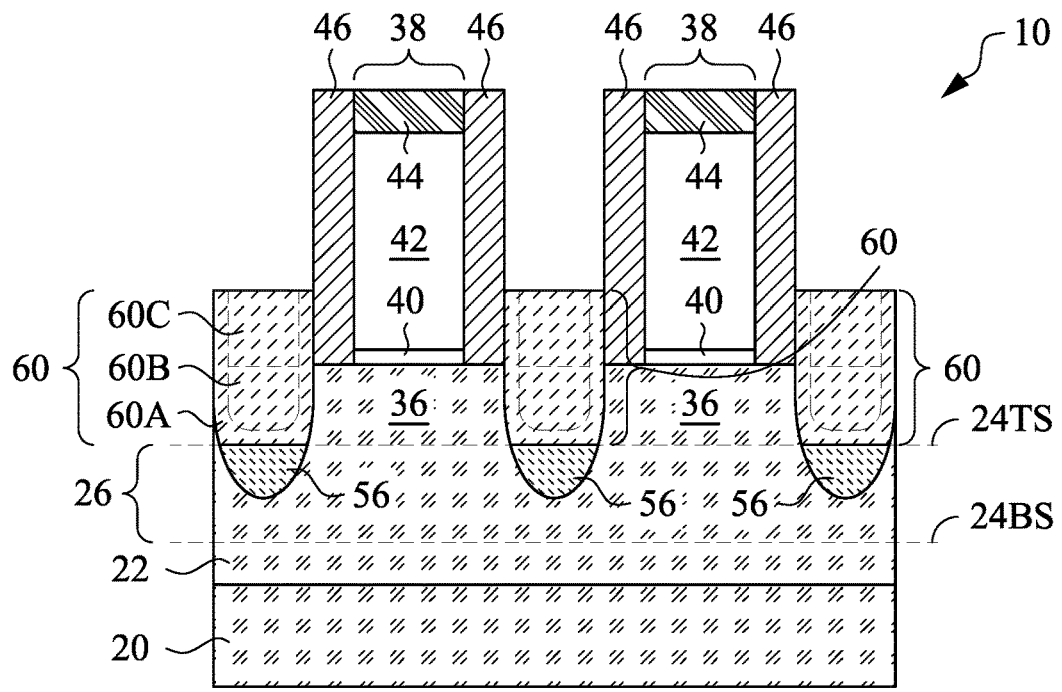

When semiconductor regions 56 are intentionally doped, the doping concentration may be controlled (by reducing the flow rate of the dopant-containing process gas) to be lower than the doping concentrations in all of well region 22 (and hence channel regions 53), source/drain extension regions 51, and source/drain regions 60 (FIG. 7A). For example, the doping concentration in semiconductor regions 56 (as deposited) may be in-situ doped to be at least one order or two orders lower than the doping concentrations in well region 22, source/drain extension regions 51, and source/drain regions 60. The intentionally doped dopant may have a concentration of the same order as that of the original semiconductor substrate 20 (before doping well region 22).

FIG. 6A illustrates the profile of semiconductor regions 56 in accordance with some embodiments, in which the top surfaces of semiconductor regions 56 are planar or substantially planar, for example, with height variation smaller than about 1 nm or smaller than about 5 Å. The top surface of semiconductor regions 56 may also be at the same level as the bottoms of protruding fins 36 within process variation, for example, with a height difference smaller than about 1 nm or smaller than about 5 Å. The top surface of semiconductor regions 56 may also be slightly lower than the bottoms of protruding fins 36, or example, by a height difference in the range between about 1 nm and about 2 nm, within process variation. FIG. 6B illustrates the profile of semiconductor regions 56 in accordance with alternative embodiments, in which the top surfaces of semiconductor regions 56 are concaved. The top corners of semiconductor regions 56 may be at the same level as the bottoms of protruding fins 36. FIG. 6C illustrates the profile of semiconductor regions 56 in accordance with yet alternative embodiments, in which there are thin layers of semiconductor regions 56 grown on the sidewalls of protruding fins 36, for example, due to the incomplete etching of semiconductor regions 56 from the sidewalls of protruding fins 36. The thickness of the sidewall portions may be smaller than about 1 nm.

The top surface of semiconductor regions 56 may be level with the bottoms of protruding fins 36 to achieve both of increased current and reduced leakage. If the top of semiconductor regions 56 is higher than the bottoms of protruding fins 36, the bottoms of the subsequently formed source/drain regions 60 (FIG. 7A) do not extend to the bottom of protruding fins 36, and hence the bottom portions of the channel regions will not be effectively used, causing the reduction in the saturation current of the FinFET. If the top of semiconductor regions 56 is lower than the bottoms of protruding fins 36, the leakage current will increase.

Figure 7B:
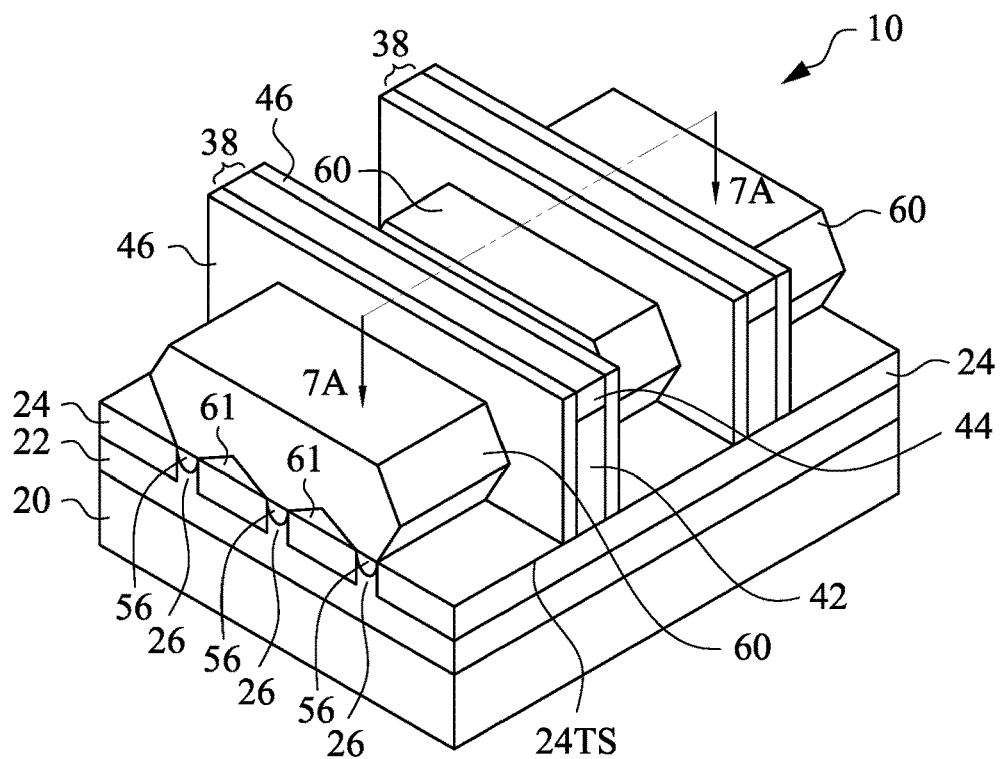

Next, referring to FIGS. 7A and 7B, epitaxy regions (source/drain regions) 60 are formed by selectively growing a semiconductor material in trenches 50. The respective process is illustrated as process 214 in the process flow 200 as shown in FIG. 14. FIG. 7B illustrates a perspective view, and FIG. 7A illustrates the reference cross-section 7A-7A in FIG. 7B. Depending on whether the resulting FinFET is a p-type FinFET or an n-type FinFET, a p-type or an n-type dopant may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 60 comprise III-V compound semiconductors such as GaAs, InP, GaN, InGaAs, InAlAs, GaSb, AlSb, AlAs, AlP, GaP, combinations thereof, or multi-layers thereof. After Trenches 50 are filled with epitaxy regions 60, the further epitaxial growth of epitaxy regions 60 causes epitaxy regions 60 to expand horizontally, and facets may be formed. The further growth of epitaxy regions 60 may also cause neighboring epitaxy regions 60 to merge with each other. Voids (air gaps) 61 may be generated.

In accordance with some embodiments, source/drain regions 60 include a plurality of sub-layers, which are referred to as 60A, 60B, and 60C (FIG. 7A). Sub layers 60A, 60B, and 60C may have compositions different from each other. For example, the germanium or carbon (if any) in sub-layers 60A, 60B, and 60C may be different from each other. The n-type dopant (when the respective FinFET is an n-type FinFET) in sub-layers 60A, 60B, and 60C may have concentrations different from each other. The p-type dopant (when the respective FinFET is a p-type FinFET) in sub-layers 60A, 60B, and 60C may have concentrations different from each other. For example, when source/drain regions 60 are n-type regions, sub-layer 60A may comprise SiAs, while sub-layers 60B and 60C may comprise SiP. Sub-layer 60B may also have the n-type dopant higher than the n-type dopant in sub-layers 60A and 60C when source/drain regions 60 are n-type regions. Conversely, sub-layer 60B may also have the p-type dopant higher than the p-type dopant in sub-layers 60A and 60C when source/drain regions 60 are p-type regions. In accordance with some embodiments, source/drain regions 60 have n-type or p-type dopant concentrations in the range between about 5E20/cm$^3$ and about 5E21/cm$^3$. In accordance with some embodiments, after the epitaxy of source/drain regions 60, no implantation process is performed to implant n-type or p-type dopant, so that the doping concentration in semiconductor regions 56 remains to be low.

Figure 8A:
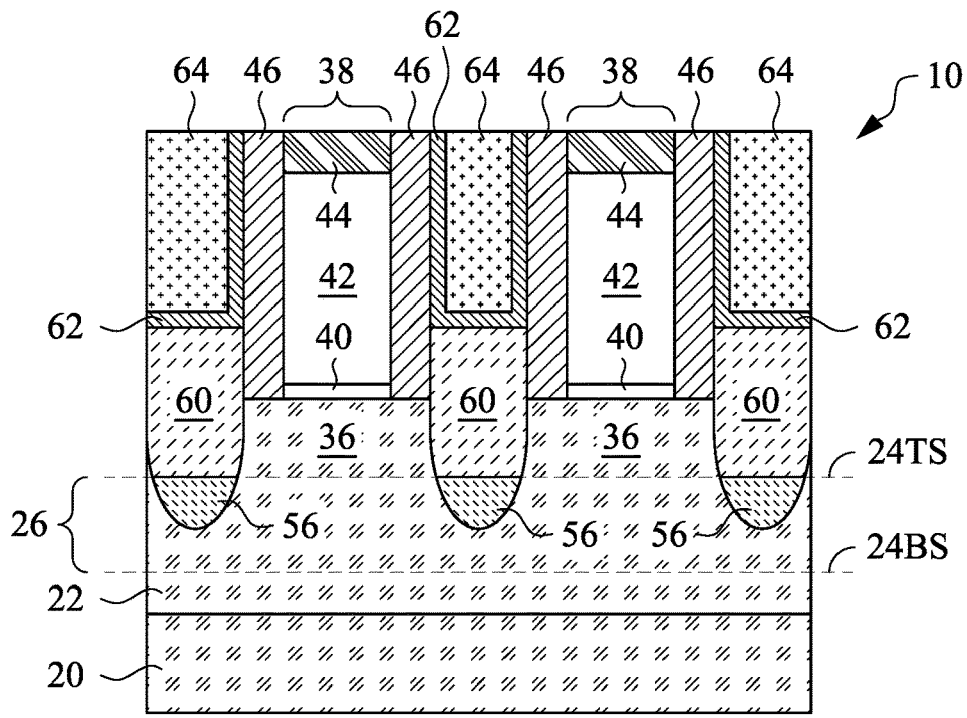
Figure 8B:
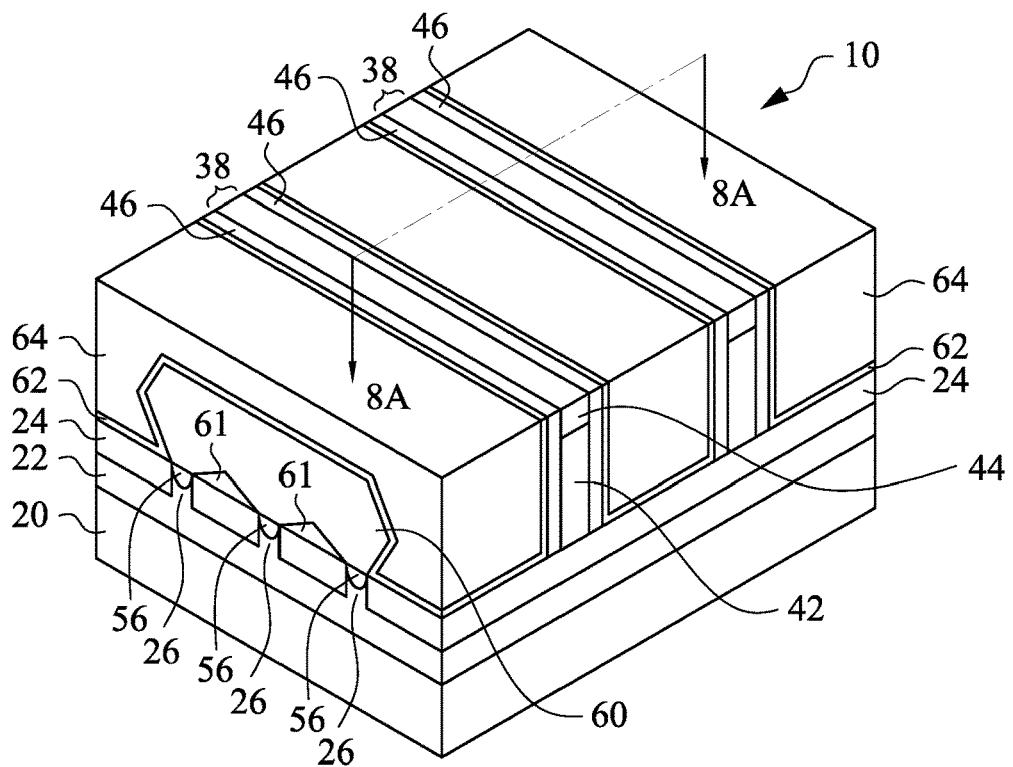

FIGS. 8A and 8B illustrate a perspective view of the structure after the formation of Contact Etch Stop Layer (CESL) 62 and Inter-Layer Dielectric (ILD) 64. The respective process is illustrated as process 216 in the process flow 200 as shown in FIG. 14. FIG. 8B illustrates a perspective view, and FIG. 8A illustrates the reference cross-section 8A-8A in FIG. 8B. CESL 62 may be formed of silicon oxide, silicon nitride, silicon carbo-nitride, or the like, and may be formed using CVD, ALD, or the like. ILD 64 may include a dielectric material formed using, for example, FCVD, spin-on coating, CVD, or another deposition process. ILD 64 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 64, dummy gate stacks 38, and gate spacers 46 with each other.

Figure 9A:
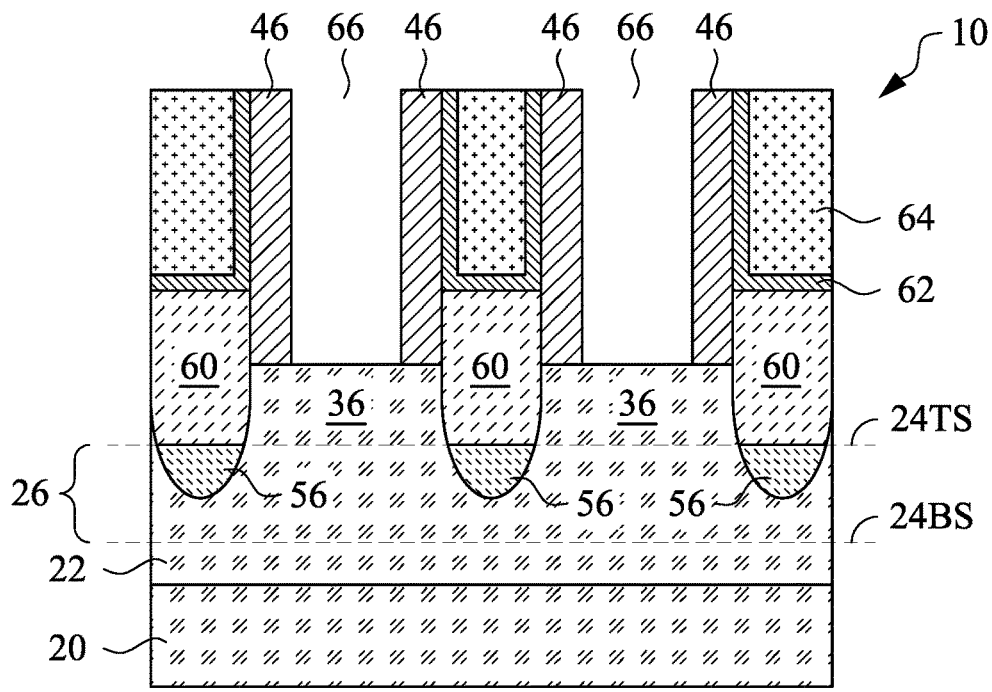
Figure 9B:
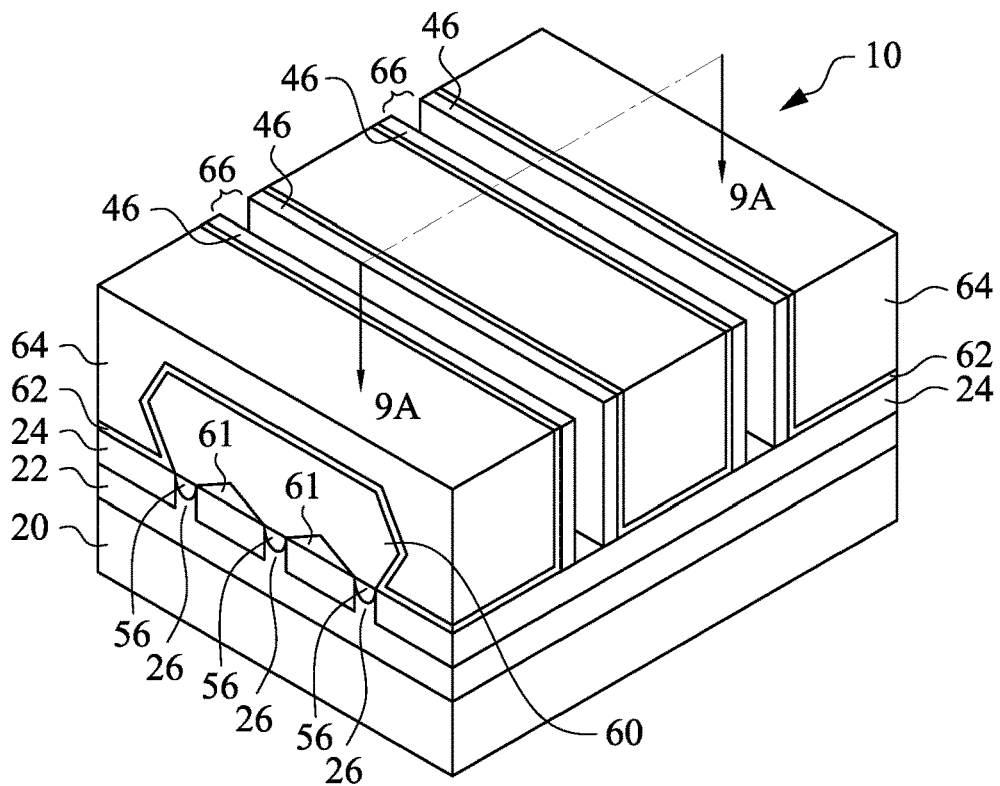

Next, the dummy gate stacks 38 including hard mask layers 44, dummy gate electrodes 42 and dummy gate dielectrics 40 are etched, forming trenches 66 between gate spacers 46, as shown in FIGS. 9A and 9B. The respective process is illustrated as process 218 in the process flow 200 as shown in FIG. 14. The top surfaces and the sidewalls of protruding fins 36 are exposed to trenches 66. FIG. 9B illustrates a perspective view, and FIG. 9A illustrates the reference cross-section 9A-9A in FIG. 9B.

Figure 10:
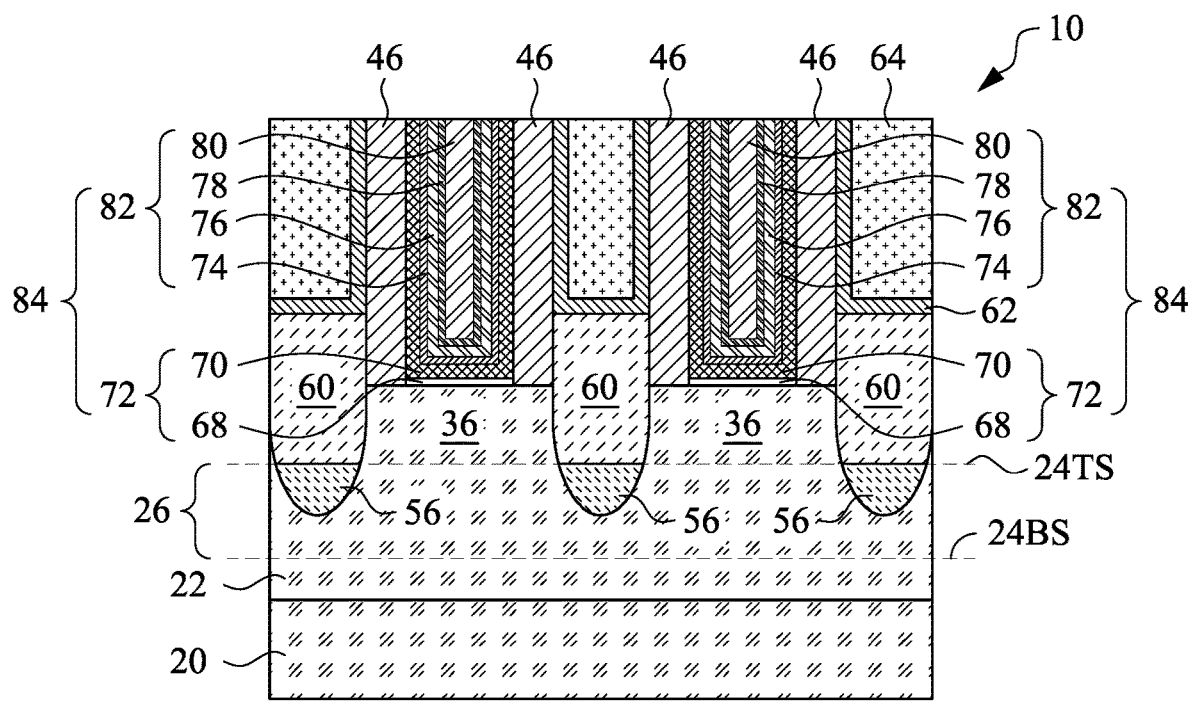

Next, as shown in FIG. 10, replacement gate stacks 84 are formed in trenches 66 (FIGS. 9A and 9B). The respective process is illustrated as process 220 in the process flow 200 as shown in FIG. 14. Replacement gate stacks 84 include gate dielectrics 72 and the corresponding gate electrodes 82. In accordance with some embodiments of the present disclosure, a gate dielectric 72 includes Interfacial Layer (IL) 68 as its lower part, as shown in FIG. 9A. IL 68 is formed on the exposed surfaces of protruding fins 36. IL 68 may include an oxide layer such as a silicon oxide layer, which is formed through the thermal oxidation of protruding fins 36, a chemical oxidation process, or a deposition process. Gate dielectric 72 may also include high-k dielectric layer 70 deposited over IL 68. High-k dielectric layer 70 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0 or higher. High-k dielectric layer 70 is formed as a conformal layer, and extends on the sidewalls of protruding fins 36 and the top surface and the sidewalls of gate spacers 46. In accordance with some embodiments of the present disclosure, high-k dielectric layer 70 is formed using ALD, CVD, PECVD, Molecular-Beam Deposition (MBD), or the like.

Further referring to FIG. 10, gate electrodes 82 are formed on gate dielectrics 72. Gate electrodes 82 may include a plurality of stacked layers 74, 76, and 78, which may be formed as conformal layers, and filling-metal regions 80 filling the rest of the trenches unfilled by the plurality of stacked layers 74, 76, and 78. Each of plurality of stacked layers 74, 76, and 78 may have the shape of a basin including a bottom and sidewall portions forming a ring and joined to the bottom. A brief formation process of gate stacks 84 are discussed below. It is appreciated that the discussed layers are an example, and different layer schemes may be adopted.

In accordance some embodiments, adhesion layer (which is also a diffusion barrier layer) 74 is formed over high-k dielectric layer 70. Adhesion layer 74 may be formed of or comprise TiN or Titanium Silicon Nitride (TiSiN). The TiN layer may be formed using ALD or CVD, and the TiSiN layer may include alternatingly deposited TiN layers and SiN layers, which are formed using ALD, for example. Since the TiN layers and SiN layers are very thin, these layers may not be able to be distinguished from each other, and are hence referred to as a TiSiN layer.

Work function layer 76 is formed over adhesion layer 74. Work function layer 76 determines the work function of the gate, and includes at least one layer, or a plurality of layers formed of different materials. The material of the work function layer 76 is selected according to whether the respective FinFET is an n-type FinFET or a p-type FinFET. For example, when the FinFET is an n-type FinFET, work function layer 76 may include TiC, TaC, TiAl, TiAlC, Ti, Al, Sc, Y, Er, La, Hf, alloys thereof, and/or multilayers thereof. When the FinFET is a p-type FinFET, work function layer 76 may include TiN, TaN, TiAlN, TiSiN, WCN, MOCN, Pt, Pd, Ni, Au, alloys thereof, and/or multilayers thereof.

In accordance with some embodiments of the present disclosure, a capping layer 78 is formed over work function layer 76. Capping layer 78 may be formed of TiN in accordance with some embodiments, and other materials such as TaN may be used. In accordance with some embodiments, capping layer 78 is formed using ALD, CVD, or the like.

Filling-metal region 80 is also formed over capping layer 78. In accordance with some embodiments, filling-metal region 80 is formed of tungsten, cobalt, aluminum, or the like, or alloys thereof, which may be formed using CVD, plating, or the like. In accordance with some embodiments, WF$_6$, WCl$_5$, WCl$_6$, SiH$_4$, H$_2$, or the like, or the combinations thereof may be used as process gases for depositing tungsten. After the formation of filling-metal region 80, a planarization process may be performed to remove excess portions of the deposited layers including high-k dielectric layer 70, stacked layers 74, 76, and 78, and filling-metal regions 80. The remaining portions of the layers are gate stacks 84, as shown in FIG. 10.

Figure 11A:
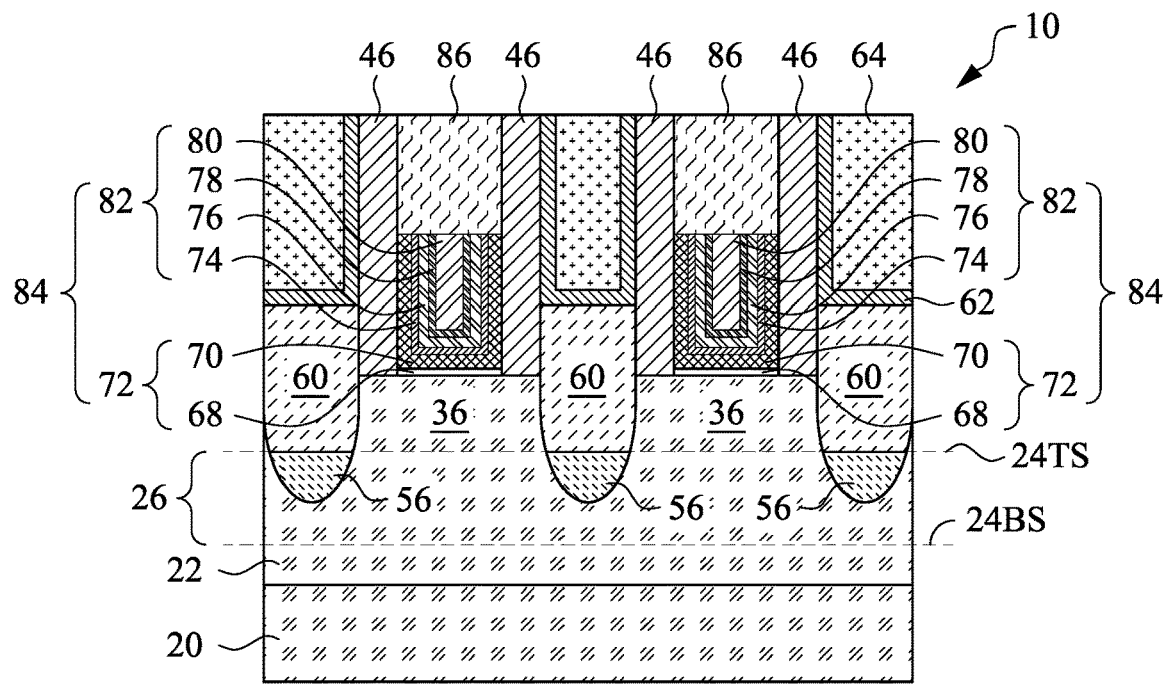
Figure 11B:
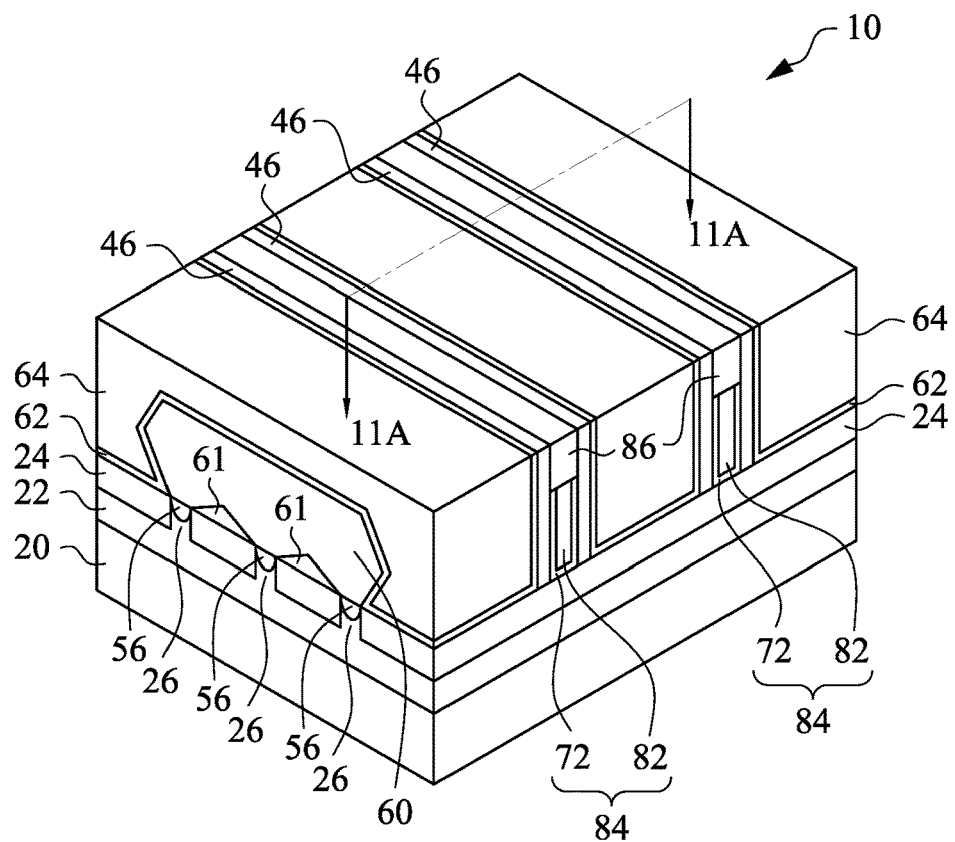

Referring to FIG. 11A, gate stacks 84 are recessed to form trenches (the spaces occupied by hard masks 86). The etching process may include a wet etching process, a dry etching process, or a wet etching process and a dry etching process. Hard masks 86 are formed to fill the trenches. The respective process is illustrated as process 222 in the process flow 200 as shown in FIG. 14. FIGS. 11A and 11B illustrate a cross-sectional view and a perspective view, respectively, wherein FIG. 11A illustrates the reference cross-section 11A-11A in FIG. 11B. In accordance with some embodiments of the present disclosure, the formation of hard masks 86 includes a deposition process to form a blanket dielectric material, and a planarization process to remove the excess dielectric material over gate spacers 46 and ILD 64. Hard masks 86 may be formed of silicon nitride, silicon oxynitride, silicon carbo-nitride, for example, or other like dielectric materials.

Figure 12:
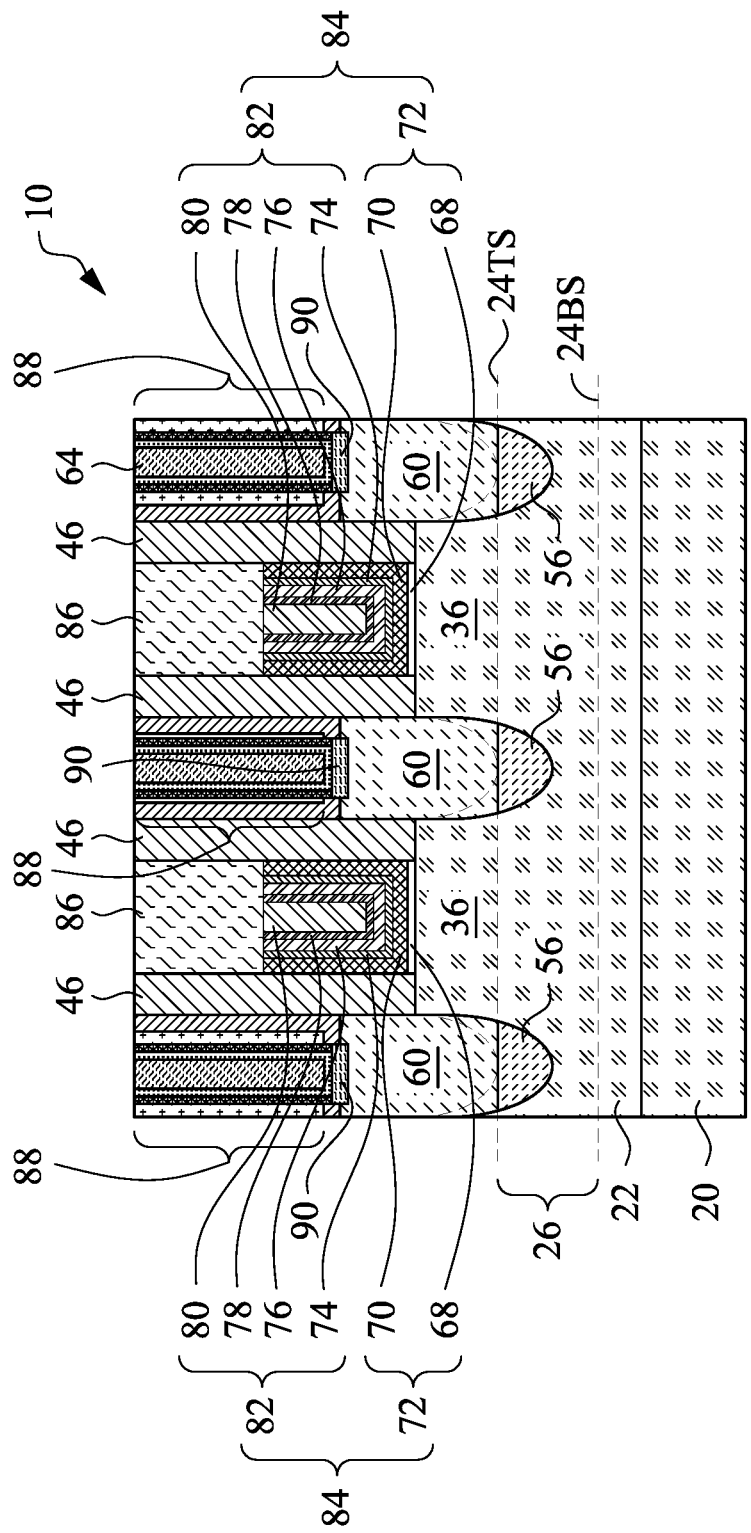

FIG. 12 illustrates the formation of lower source/drain contact plugs 88 and source/drain silicide regions 90. The respective process is illustrated as process 224 in the process flow 200 as shown in FIG. 14. In accordance with some embodiments of the present disclosure, the formation process include etching ILD 64 and CESL 62 to form source/drain contact openings, depositing a metal layer (such as a titanium layer, a cobalt layer, or the like) extending into the source/drain contact openings, depositing a barrier layer (such as a titanium nitride layer), and performing an annealing process, so that the bottom portion of the metal layer reacts with source/drain regions 60 to form silicide regions 90. The barrier layer and the remaining sidewall portions of the metal layer may be removed or left un-removed. Another barrier layer such as a titanium nitride layer may be deposited. The remaining source/drain contact openings may be filled by a metallic material such as cobalt, tungsten, other applicable metals, or the alloys thereof. A planarization such as a CMP process or a mechanical grinding process is then performed to remove excess materials, and to level the top surface of contact plugs 88 with the top surface of ILD 64.

Figure 13A:
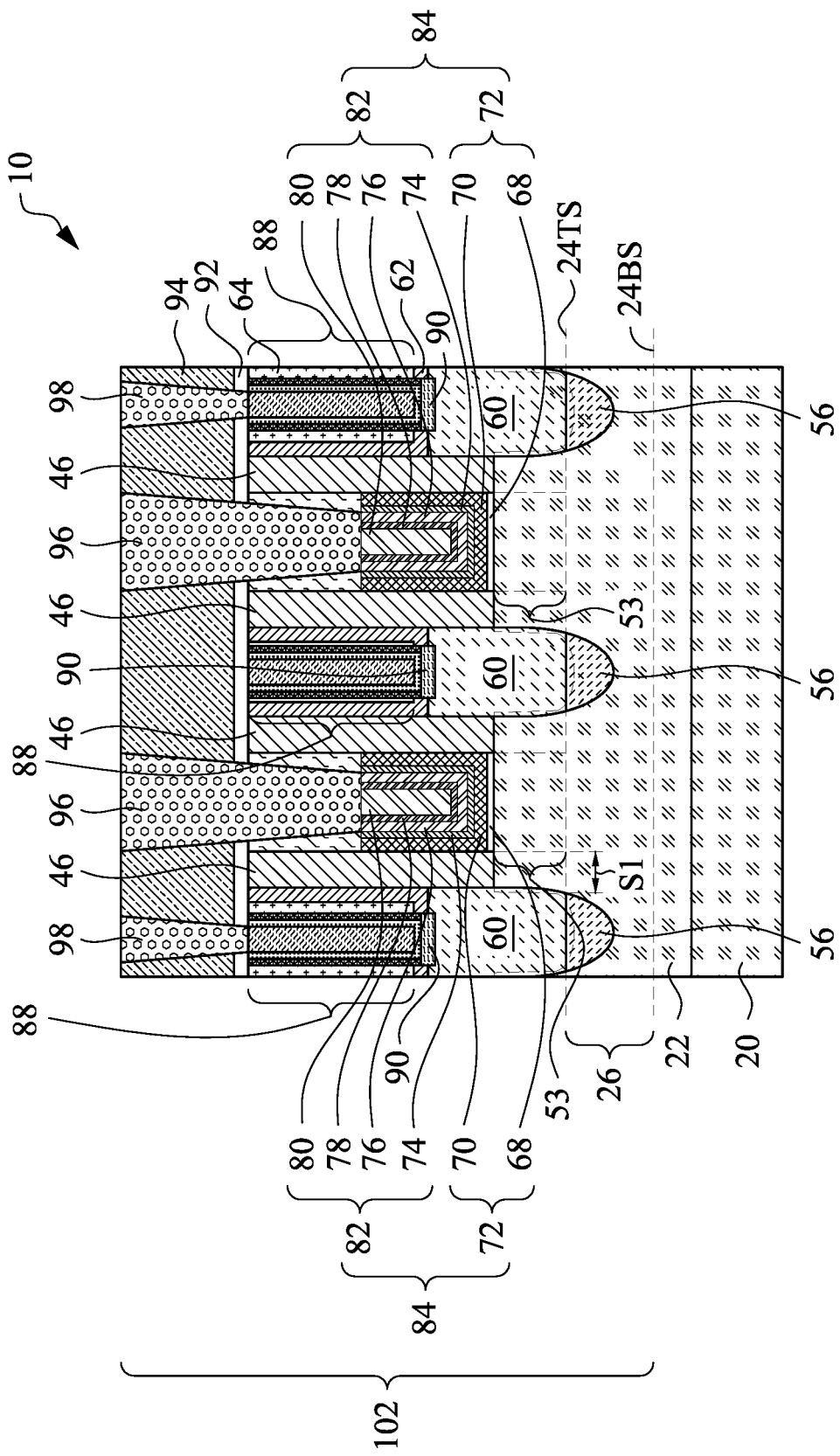
Figure 13B:
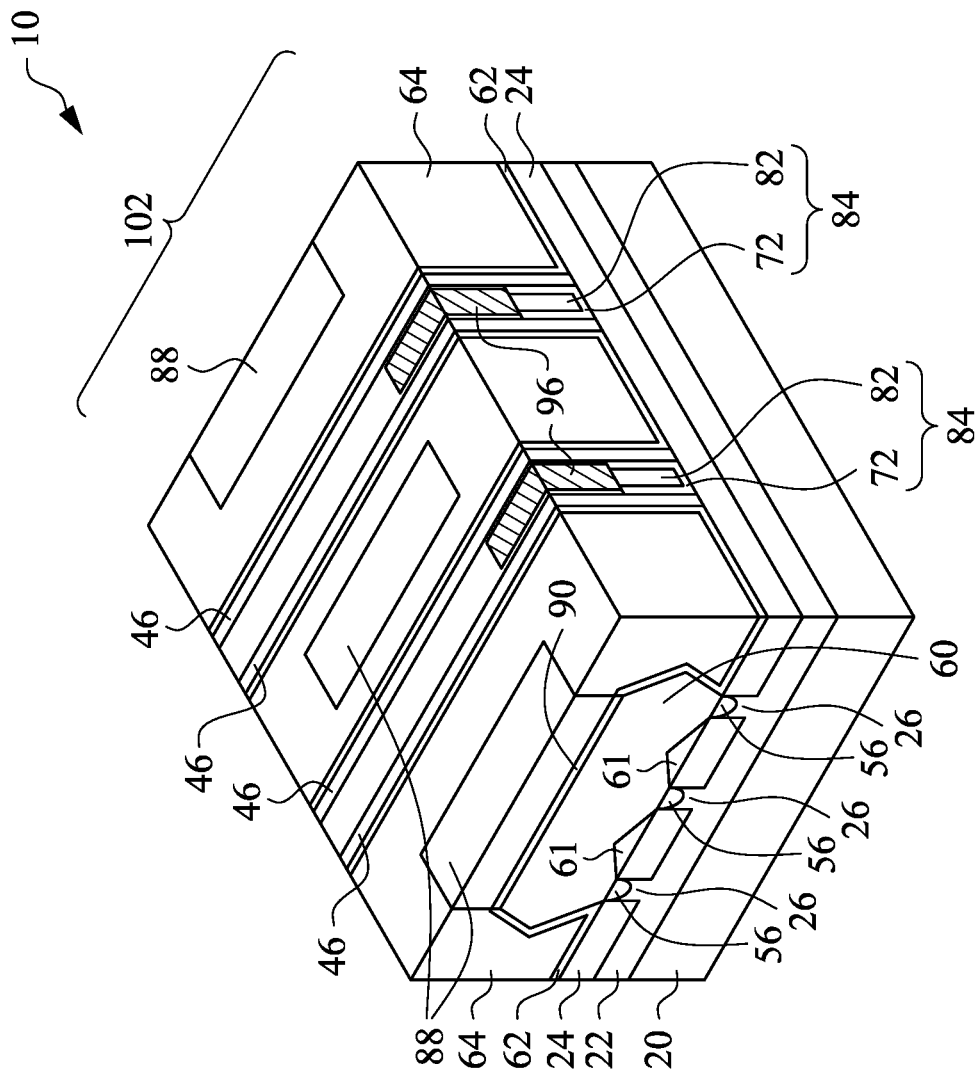

FIGS. 13A and 13B illustrate the formation of Etch Stop Layer (ESL) 92 and dielectric layer 94 (which may also be an ILD) over ESL 92. The respective process is illustrated as process 226 in the process flow 200 as shown in FIG. 14. ESL 92 may be formed of or comprise silicon nitride, silicon carbon nitride, silicon carbon oxide, carbon nitride, aluminum oxide, aluminum nitride, the like, or multilayers thereof. Dielectric layer 94 may be formed of or comprise silicon dioxide, a low-k dielectric material, silicon oxynitride, PSG, BSG, BPSG, USG, FSG, OSG, SiOC, a spin-on glass, a spin-on polymer, or the like. ESL 92 and dielectric layer 94 may be deposited by using spin-on coating, CVD, ALD, LPCVD, PECVD or the like.

Gate contact plugs 96 and upper source/drain contact plugs 98 are then formed. The respective process is illustrated as process 228 in the process flow 200 as shown in FIG. 14. The formation process may include etching dielectric layer 94 and ESL 92 to form openings, until gate electrodes 82 and source/drain contact plugs 88 are revealed, filling a conductive layer(s) to fill the openings, and performing a planarization process to removed excess portions of the conductive layers. FinFET 102 is thus formed.

In accordance with some embodiments, at the bottom of protruding fins 36, the proximity S1 is reduced, for example, the proximity S1 may be in the range between about 6 nm and about 12 nm. As address above, the reduction of the proximity S1 is achieved by forming deeper trenches. The deeper trenches, however, may result in the increase in leakage currents between neighboring source/drain regions. In accordance with the embodiments of the present disclosure, semiconductor regions 56 are formed as having no p/n doping or low p/n doping in order to reduce the leakage currents. A discussion of how semiconductor regions 56 may reduce the leakage is provided below. The discussion is provided using n-type FinFETs as an example. It is appreciated that the discussion may also be applied to p-type FinFETs.

The source/drain regions 60 of n-type FinFETs are of n-type, and the well region 22 of the n-type FinFETs is of p-type. Semiconductor regions 56 may be of n-type or p-type either due to the unintentional doping, intentional doping, or intentional anti-doping. Semiconductor regions 56 may also be intrinsic without p-type or n-type doping. The n-type dopant in the source/drain regions 60 and the p-type dopant in well region 22 may diffuse into the semiconductor regions 56. Accordingly, when semiconductor regions 56 are intrinsic or n-type regions during the epitaxy, their portions closer to the respective overlying source/drain regions 60 are of n-type, and their portions closer to the well region 22 are of p-type. Depletion regions are formed at the regions close to the interfaces between the n-type portions and p-type portions. When semiconductor regions 56 are anti-doped as p-type, depletion regions are formed at the interfaces between n-type source/drain regions 60 and the p-type semiconductor regions 56.

Due to the low concentrations of dopants in semiconductor regions 56, the depletion regions are wider than in conventional FinFETs, in which there is no semiconductor region 56 formed, and source/drain regions 60 are in contact with well region 22. Accordingly, the leakage currents are reduced.

The embodiments of the present disclosure have some advantageous features. By forming trenches (which are used for forming source/rain regions) deeper into the semiconductor strips, the curved bottoms of the openings extend to lower positions, and the proximity (the distance from source/drain region to the corresponding channel regions) is reduced. The formation of deeper trenches, however, may result in the increase in leakage currents. In accordance with embodiments of the present disclosure, the bottom portions of the trenches are filled with semiconductor regions that either undoped or doped (unintentionally and/or intentionally) to have a low doping concentration. The widths of the resulting depletion regions are increased, and the undesirable increase in leakage current is reduced.

In accordance with some embodiments of the present disclosure, a method comprises forming a semiconductor fin protruding higher than a top surface of an isolation region, wherein the semiconductor fin overlaps a semiconductor strip, and the semiconductor strip contacts the isolation region; forming a gate stack on a sidewall and a top surface of a first portion of the semiconductor fin; etching the semiconductor fin and the semiconductor strip to form a trench, wherein the trench comprises an upper portion in the semiconductor fin and a lower portion in the semiconductor strip; growing a semiconductor region in the lower portion of the trench, wherein process gases used for growing the semiconductor region are free from both of n-type dopant-containing gases and p-type dopant-containing gases; and growing a source/drain region in the upper portion of the trench, wherein the source/drain region comprises a p-type or an n-type dopant. In an embodiment, a top surface of the semiconductor region is level with a bottom surface of the semiconductor fin. In an embodiment, the semiconductor region is grown using a bottom-up deposition process. In an embodiment, the lower portion of the trench has a depth in a range between about 2 nm and about 4 nm. In an embodiment, the semiconductor region is doped to have a first conductivity type opposite to a second conductivity type of the source/drain region. In an embodiment, the semiconductor region is doped to have a same conductivity type as the source/drain region. In an embodiment, the semiconductor fin has a first sidewall facing the upper portion of the trench, and the semiconductor strip has a second sidewall facing the lower portion of the trench, and the first sidewall is vertical and straight, and the second sidewall is curved. In an embodiment, the first sidewall and the second sidewall join at a position level with or lower than a bottom of the semiconductor fin. In an embodiment, the semiconductor region is grown as having a planar top surface. In an embodiment, the semiconductor region is grown as having a concaved top surface. In an embodiment, when the semiconductor region is grown, the semiconductor region remains to be exposed to the upper portion of the trench.

In accordance with some embodiments of the present disclosure, a method comprises forming a semiconductor fin protruding higher than a top surface of an isolation region;

forming a gate stack on the semiconductor fin; etching the semiconductor fin to form a trench, wherein the trench further extends into a semiconductor strip underlying the semiconductor fin, and extends into a well region; growing a semiconductor region in a lower portion of the trench, wherein a top surface of the semiconductor region is level with or lower than a bottom of the semiconductor fin, and a first dopant concentration of the semiconductor region is lower than a second dopant concentration of the well region, and wherein the first dopant concentrations and the second dopant concentrations are dopant concentrations of n-type and p-type dopants; and growing a source/drain region over the semiconductor region. In an embodiment, the semiconductor region is an intrinsic region. In an embodiment, the growing the semiconductor region is performed using process gases free from n-type and p-type dopant-containing process gases. In an embodiment, the growing the semiconductor region is performed using process gases comprising an n-type or a p-type dopant-containing process gas. In an embodiment, the semiconductor region and the source/drain region have opposite conductivity types. In an embodiment, the method further comprises forming a source/drain extension region in the semiconductor fin, wherein the first dopant concentration is further lower than a third dopant concentration in the source/drain extension region.

In accordance with some embodiments of the present disclosure, a method comprises forming a well region in a semiconductor substrate; forming isolation regions extending into the well region; recessing the isolation regions, wherein a portion of the well region protrudes higher than the isolation regions to form a semiconductor fin, with a portion of the well region located between the isolation regions as a semiconductor strip; growing a semiconductor region in the semiconductor strip, wherein process gases for growing the semiconductor region are free from both of p-type and n-type dopants; and forming a source/drain region over the semiconductor region, wherein the semiconductor region has a first doping concentration lower than a second doping concentration of the well region and a third doping concentration of the source/drain region. In an embodiment, the semiconductor region is doped by a p-type residue or an n-type residue left in a process chamber used for growing the semiconductor region to have the first doping concentration. In an embodiment, an interface between the semiconductor region and the source/drain region is at a same level as a top surface of the isolation regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin protruding higher than a top surface of an isolation region, wherein the semiconductor fin overlaps a semiconductor strip, and the semiconductor strip contacts the isolation region;
   forming a gate stack on a sidewall and a top surface of a first portion of the semiconductor fin;
   etching the semiconductor fin and the semiconductor strip to form a trench, wherein the trench comprises an upper portion in the semiconductor fin and a lower portion in the semiconductor strip;
   growing a semiconductor region in the lower portion of the trench, wherein process gases used for growing the semiconductor region are free from both of n-type dopant-containing gases and p-type dopant-containing gases; and
   growing a source/drain region in the upper portion of the trench, wherein the source/drain region comprises a p-type or an n-type dopant, and wherein the semiconductor region is doped to have a first conductivity type opposite to a second conductivity type of the source/drain region.

2. The method of claim 1, wherein a top surface of the semiconductor region is level with a bottom surface of the semiconductor fin.

3. The method of claim 1, wherein the semiconductor region is grown using a bottom-up deposition process.

4. The method of claim 1, wherein the lower portion of the trench has a depth in a range between about 2 nm and about 4 nm.

5. The method of claim 1, wherein the source/drain region physically contacts a sidewall of the semiconductor fin.

6. The method of claim 1, wherein the semiconductor fin has a first sidewall facing the upper portion of the trench, and the semiconductor strip has a second sidewall facing the lower portion of the trench, and the first sidewall is vertical and straight, and the second sidewall is curved.

7. The method of claim 6, wherein the first sidewall and the second sidewall join at a position level with or lower than a bottom of the semiconductor fin.

8. The method of claim 1, wherein the semiconductor region is grown as having a planar top surface.

9. The method of claim 1, wherein the semiconductor region is grown as having a concaved top surface.

10. The method of claim 1, wherein when the semiconductor region is grown, the semiconductor region remains to be exposed to the upper portion of the trench.

11. A method comprising:
    forming a semiconductor fin protruding higher than a top surface of an isolation region, wherein the semiconductor fin overlaps a semiconductor strip;
    forming a gate stack on the semiconductor fin;
    etching the semiconductor fin to form a trench, wherein the trench further extends into the semiconductor strip, and extends into a well region, and wherein a first sidewall and a second sidewall of the semiconductor strip are exposed to the trench, with the first sidewall and the second sidewall being on opposing sides of the trench;
    growing a semiconductor region in a lower portion of the trench, wherein a planar top surface of the semiconductor region is level with or lower than a bottom of the semiconductor fin, with opposing ends of the planar top surface physically contacting the first sidewall and the second sidewall, and a first dopant concentration of the semiconductor region is lower than a second dopant concentration of the well region, and wherein the first dopant concentration and the second dopant concentration are dopant concentration of n-type and p-type dopants; and
    growing a source/drain region over the semiconductor region.

12. The method of claim 11, wherein the semiconductor region is an intrinsic region.

13. The method of claim 11, wherein the growing the semiconductor region is performed using process gases free from n-type and p-type dopant-containing process gases.

14. The method of claim 11, wherein the growing the semiconductor region is performed using process gases comprising an n-type or a p-type dopant-containing process gas.

15. The method of claim 14, wherein the semiconductor region and the source/drain region have opposite conductivity types.

16. The method of claim 15 further comprising forming a source/drain extension region in the semiconductor fin, wherein the first dopant concentration is further lower than a third dopant concentration in the source/drain extension region.

17. The method of claim 11, wherein the planar top surface of the semiconductor region is level with the bottom of the semiconductor fin.

18. A method comprising:
forming a well region in a semiconductor substrate;
forming isolation regions extending into the well region;
recessing the isolation regions, wherein a portion of the well region protrudes higher than the isolation regions to form a semiconductor fin, with a portion of the well region located between the isolation regions as a semiconductor strip;
growing a semiconductor region in the semiconductor strip, wherein process gases for growing the semiconductor region are free from both of p-type and n-type dopants; and
forming a source/drain region over the semiconductor region, wherein the semiconductor region has a first doping concentration lower than a second doping concentration of the well region and a third doping concentration of the source/drain region, and wherein an interface between the semiconductor region and the source/drain region is at a same level as a top surface of the isolation regions.

19. The method of claim 18, wherein the semiconductor region is doped by a p-type residue or an n-type residue left in a process chamber used for growing the semiconductor region to have the first doping concentration.

20. The method of claim 18, wherein the interface is planar, and both of a first end and a second end of the interface are in contact with sidewalls of the semiconductor strip.

* * * * *